Sept. 3, 1963

A. HAFNER ETAL 3,102,985

TRANSISTOR PULSE AMPLIFIER

Filed Oct. 28, 1960

INVENTORS.
ALEXANDER HAFNER
RAYMOND E. KONCEN

Charles E. Vautrain Jr. AGENT

BY Richard C. Reed

ATTORNEY

United States Patent Office 3,102,985

Patented Sept. 3, 1963

3,102,985

TRANSISTOR PULSE AMPLIFIER

Alexander Hafner, Washington, D.C., and Raymond E. Koncen, Oxon Hill, Md., assignors to the United States of America as represented by the Secretary of the Navy Filed Oct. 28, 1960, Ser. No. 65,866
4 Claims. (Cl. 330—16)
(Granted under Title 35, U.S. Code (1952), sec. 266)

The invention described herein may be manufactured and used by or for the Government of the United States of America for governmental purposes without the payment of any royalties thereon or therefor.

This invention relates generally to pulse amplification and particularly to negative pulse amplification of microsecond duration by transistors.

It is necessary in the field of information transmission by microsecond pulses to produce an amplified pulse that is as nearly symmetrical in shape to the input pulse as can be obtained. Pulse amplification, and particularly negative pulse amplification by transistors, presents problems differing from those encountered in amplification by vacuum tubes, especially as to temperature effects and parameter differences between the transistors. The present invention provides a microsecond pulse amplifier which overcomes the foregoing impediments and produces an amplified pulse of high fidelity. It can also be used to amplify pulses of greater than microsecond duration.

Pulse shape distortion and instability introduced by cascaded stages are other undesirable factors which are minimized or eliminated entirely in the pulse information reproduced by the present transistor amplifier.

Accordingly, it is an object of the present invention to provide a transistor amplifier capable of amplifying microsecond pulses or longer pulses with minimum distortion.

It is a further object of this invention to provide a transistor microsecond pulse amplifier having very high gain in a single stage which includes two transistors.

It is a further object of the present invention to provide a transistor amplifier capable of amplifying microsecond pulses or pulses of longer duration over a wide range of magnitude and time separation without distortion or other abnormal operation.

It is a further object of this invention to provide a transistor microsecond pulse amplifier having stages which may be cascaded without instability.

Various other objects and advantages will appear from the following description of an embodiment of the invention, and the novel features will be particularly pointed out hereinafter in connection with the appended claims.

Figures 1, 2:
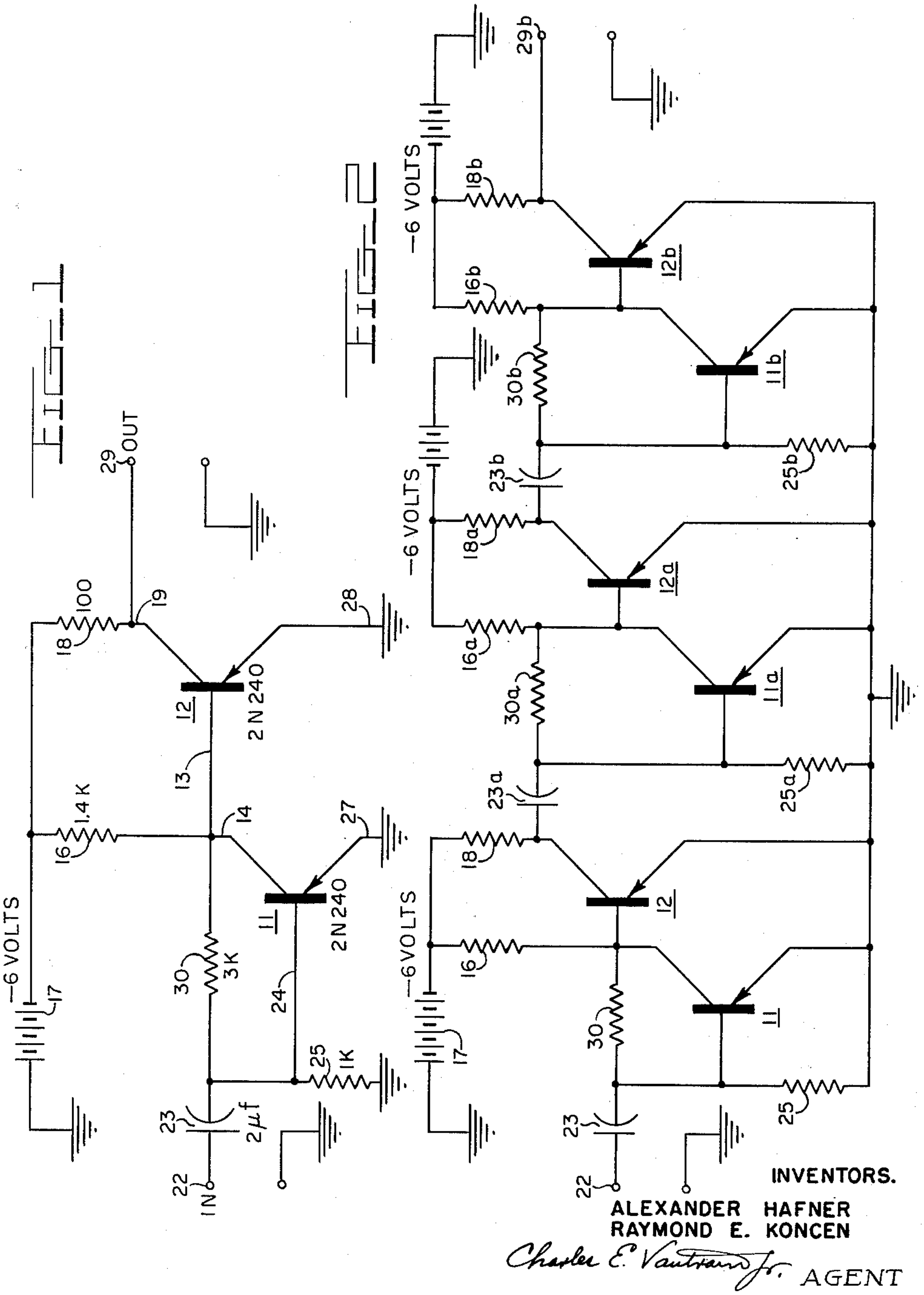
FIG. 1 is a circuit diagram of one embodiment of the invention.
FIG. 2 is a circuit diagram of the embodiment in FIG. 1 including additional stages.

In the embodiment of the invention illustrated in FIG. 1 the amplifier is shown including p-n-p transistors 11 and 12 having the base electrode 13 of transistor 12 connected to the collector electrode 14 of transistor 11. A D.C. load resistor 16 connects base 13 and collector 14 to a negative D.C. voltage source 17, while resistor 18 connects source 17 to collector electrode 19 of transistor 12.

The signal to be amplified is introduced at terminal 22 and then advances through blocking capacitor 23 to base electrode 24 of transistor 11. Base electrode 24 is connected to ground potential through base resistor 25 while emitter electrodes 27 and 28 are directly coupled to ground potential. Resistor 30 is inserted between collector 14 and base electrode 24. The output is taken from terminal 29 which is connected to collector 19 in parallel with resistor 18.

Referring now to FIG. 2 there is shown the two-transistor stage of FIG. 1 with an additional pair of stages, denoted by suffixes 23*a*, 30*a*, etc., and 23*b*, 30*b*, etc., cascaded to provide increased amplification. Each additional stage is shown with a separate D.C. potential source, however, it will be appreciated that a single potential source may be applied to the entire circuit and an RC recoupling filter included between stages in conventional form. The component values will be substantially unchanged in the cascade arrangement where the circuit is intended to stress fidelity, and may be altered selectively to stress other desired circuit performance.

The operation of the circuit is as follows, beginning at a time before a signal is introduced and with transistor 11 close to cutoff or in a quiescent state and transistor 12 close to saturation.

At such time, a negative signal passed through capacitor 23 to the base electrode 24 will be amplified by transistor 11 and an amplified positive pulse, inverted by the transistor, made to appear on collector 14. A portion of the amplified signal is fed back through voltage feedback resistor 30 to base electrode 24. Feedback resistor 30 provides stability by compensating for differences in amplification between transistors of the same type. In the same manner, resistor 30 reduces the effects of change in gain due to temperature differences and, in fact, will reduce the effects of any gain change. When transistor 11 is driven at a high current, resistor 30 reduces the distortion produced by the high pulse current.

Resistor 25 tends to hold the D.C. potential of base 24 substantially constant so as to reduce the effect of gain changes.

Resistors 16 and 18 are collector load resistors whose functions are to provide a voltage change when the signal is applied to the circuit. Resistor 18 has a lower value than resistor 16 so as to provide a low output impedance.

The amplified positive pulse is applied to transistor 12 through base electrode 13 and inverted and further amplified by transistor 12 which also provides a low output impedance so that another stage may be capacity-coupled into, as shown in FIG. 2, without further impedance transformation.

Emitter electrodes 27 and 28 are directly coupled to ground and by such direct coupling eliminate the use of resistance and capacitance components which ordinarily are inserted between an emitter electrode and ground. The elimination of a capacitance element further removes the lower limit on frequency response which would be imposed by coupling to ground through a capacitor.

It will be appreciated that although values have been assigned all resistance and capacitance components in FIG. 1, such values are not to be construed as limiting the scope of the present invention. The values given have been determined as providing optimum performance for one embodiment of the invention, namely, that embodiment for amplifying negative pulses of microsecond duration using a source of potential of −6 volts. It is noted that the ratio of resistors 16 and 18 is of the order of 1:10. In the stated embodiment, accurate pulse reproduction of multiple microsecond pulses is obtained, with accuracy stressed in lieu of gain, but nevertheless at a gain of substantially 34 db which is entirely satisfactory for a wide variety of applications. The combined high fidelity and amplification without undue distortion or instability is not obtainable through transistor amplifiers in the present state of the art.

Where increased gain is desired, resistors 16 and 18 may be increased in value and, in addition, either resistor 30 or 25. Changing resistor 30 may, however, require a commensurate change in resistor 25 in order to maintain a D.C. bias at or near cutoff. When such increased gain is obtained there is some sacrifice in accuracy of pulse reproduction, or fidelity.

Positive pulse amplification may be obtained from a modification of the basic circuit wherein p-n-p transistors 11 and 12 are replaced by n-p-n transistors, not shown, and by inverting the polarity of the source of potential. The resistor values may remain substantially unchanged provided the n-p-n transistors have substantially the same characteristics as p-n-p transistors 11 and 12.

The cascade embodiment of FIG. 2 provides higher gain in relation to the number of stages added, with the upper limit of amplification determined in part by noise amplification.

There is thus provided a basic transistor amplification circuit for microsecond pulse amplification whose particular interrelation of component values provides a high degree of accuracy in pulse reproduction as well as a substantial amplification of the input signal. By selective changing of component values, optimum performance may be obtained in other results than accuracy of pulse reproduction, such as greater amplification. The circuit uses few components and is simple to assemble and enlarge by the addition of cascaded stages. The circuit can also be used to amplify pulses of varying duration without substantial sacrifice of fidelity.

It will be understood that various changes in the details and arrangements of components and circuits, and in the selection of pulses and pulse reproduction which has been described and illustrated herein in order to explain the nature of the invention, may be made by those skilled in the art within the principle and scope of the invention as expressed in the appended claims.

What is claimed is:

1. A single stage pulse amplifier comprising a first and second transistor, each having base, collector and emitter electrodes, a pulse input terminal connected to the base electrode of said first transistor, the collector electrode of said first transistor being directly connected to the base electrode of said second transistor, first and second collector load impedances connected respectively to said first and second transistor collector electrodes, said first load impedance being greater than the input impedance at said input terminal and said second load impedance being less than the input impedance at said input terminal, said emitter electrodes each being directly connected to ground, a feedback resistance connected between the collector and base electrodes of said first transistor, and an output terminal connected to the collector electrode of said second transistor whereby said amplifier provides high gain with a low output impedance.

2. A single stage pulse amplifier comprising a first and second transistor having base, collector and emitter electrodes, a pulse input terminal connected to the base electrode of said first transistor, the collector electrode of said first transistor being directly connected to the base electrode of said second transistor, a feedback resistance connected between the collector and base electrodes of said first transistor, first and second collector load impedances connected respectively to said first and second transistor collector electrodes, said first load impedance being greater than the input impedance at said input terminal and said second load impedance not exceeding the input impedance at said input terminal, said second load impedance being less than said first load impedance by at least the order of ten, said emitter electrodes each being directly connected to ground, and an output terminal connected to the collector electrode of said second transistor whereby said amplifier provides high gain with a low output impedance.

3. A multistage pulse amplifier comprising a plurality of pairs of first and second transistors each having base, collector and emitter electrodes, a pulse input terminal connected to the base electrode of each of said first transistors, the collector electrode of each of said first transistors being directly connected to the base electrode of each of said second transistors, a feedback resistance connected between the collector and base electrodes of only the first transistor of each pair of first and second transistors, a plurality of first and second collector load impedances each connected respectively to said first and second collector electrodes of said first and second transistors, said first load impedances being greater than the input impedance at each of said respective input terminals and said second load impedances being less than the input impedance at each of said respective input terminals, said emitter electrodes each being directly connected to ground, an output terminal connected to the collector electrode of each of said second transistors, and means connecting the output and input terminals of the intermediate stages of said multistage pulse amplifier whereby each output terminal except the output terminal of the last stage is connected to the input terminal of the next succeding stage to provide high gain and high fidelity.

4. The circuit claimed in claim 3 wherein each of said first transistors is D.C. coupled to its respective second transistor and each pair of first and second transistors is A.C. coupled to the preceding pair of first and second transistors.

References Cited in the file of this patent

UNITED STATES PATENTS

| | | |
|---|---|---|
| 2,801,297 | Becking et al. | July 30, 1957 |
| 3,040,264 | Weidner | June 19, 1962 |
| 3,073,968 | Tribby | Jan. 15, 1963 |

FOREIGN PATENTS

| | | |
|---|---|---|
| 213,995 | Australia | Mar. 14, 1958 |